United States Patent [19]
Glogolja

[11] 3,931,547
[45] Jan. 6, 1976

[54] PROTECTION CIRCUIT

[75] Inventor: Miroslav Glogolja, Edison, N.J.

[73] Assignee: RCA Corporation, New York, N.Y.

[22] Filed: Aug. 9, 1974

[21] Appl. No.: 496,358

[52] U.S. Cl. .............. 317/31; 317/33 R; 330/207 P
[51] Int. Cl.² .......................................... H02H 3/28
[58] Field of Search ............ 330/207 P; 321/11, 13; 317/14 D, 31, 33 R, 33 VR

[56] References Cited
UNITED STATES PATENTS

| | | | |
|---|---|---|---|
| 3,102,241 | 8/1963 | Johnstone | 330/207 P |
| 3,200,346 | 8/1965 | Young | 330/207 P |
| 3,585,514 | 6/1971 | Kubicz | 330/207 P |
| 3,711,763 | 1/1973 | Peterson | 317/33 V |
| 3,754,163 | 8/1973 | Sykes | 317/14 D |
| 3,805,088 | 4/1974 | Sugihara et al. | 317/33 V |

Primary Examiner—J. D. Miller
Assistant Examiner—Harry E. Moose, Jr.
Attorney, Agent, or Firm—Harold Christoffersen; Samuel Cohen; Kenneth Watov

[57] ABSTRACT

The amplitude is detected of both the input and output signals of the circuit (such as an audio amplifier) it is desired to protect. When, for example, a short circuit occurs across the load being driven, there is a sudden change in the ratio of these amplitudes and in response to this change, the signal to the output driver stage of the circuit is shunted to ground.

11 Claims, 1 Drawing Figure

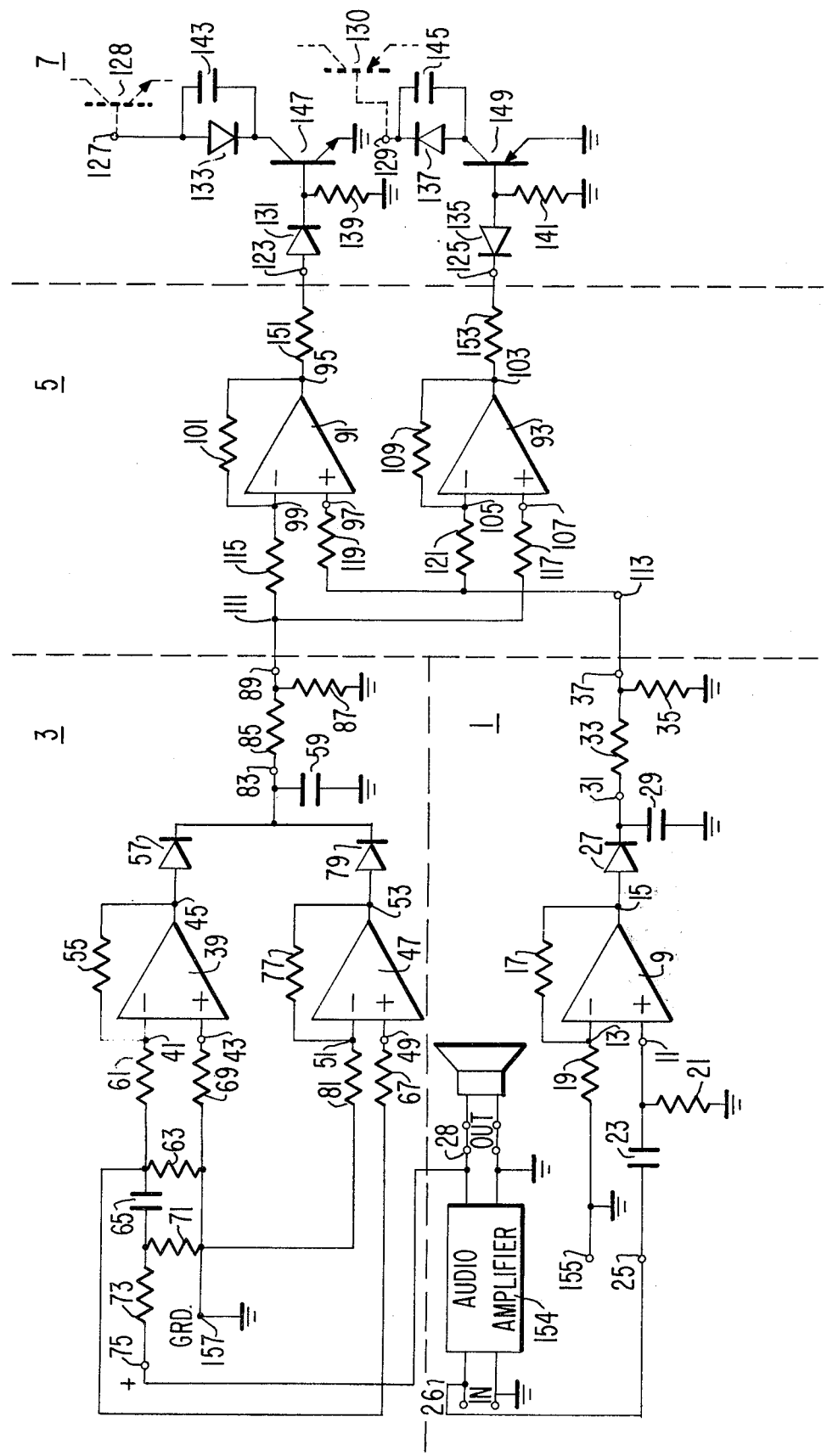

PROTECTION CIRCUIT

This invention relates generally to protection circuits.

Many short circuit protection circuits known in the art are designed to limit the current through an amplifier device, or limit the voltage applied to the input terminal of the device, in the event of a short circuit across the output terminal of the device. For example, Teshirogi U.S. Pat. No. 3,564,338 discloses an overvoltage and undercurrent protective circuit for a transistor amplifier. The current passing through the amplifier is sensed and a voltage proportional thereto obtained. When this voltage differs from the voltage applied to the input terminal of the amplifier by more than a given amount, a protective transistor at the input terminal of the amplifier is switched to its conductive condition. This shorts the input terminal of the amplifier to ground.

However, shorting the input circuit to the amplifier does not turn off the output stage of the amplifier; it only limits the current of this stage to a predetermined level. Such limiting may prevent catastrophic failure of the device in the event of a short circuit across the output terminal of the device, but the output stage of the device will still draw a finite current, and dissipate power as a result. The initial short circuit current, followed by the limited current flow through the device, may cause the device to heat to temperatures exceeding its thermal design, and become damaged or fail. Further, such protection circuits can, in some cases, cause damage to the signal source connected to the input terminal of the amplifier, due to transients or current overload.

In the circuits of the present application, the voltage across the load, rather than the current passing through an amplifier, is sensed. When the ratio between this voltage and that present at the input terminal of the amplifier driving the load drops to lower than a given value, as would occur, for example, when the load impedance changed to lower than a given value, the output stage of the amplifier is effectively disabled. This may be accomplished by placing a low impedance path across the input terminals of the final stage.

The invention is illustrated in the drawing, the sole FIGURE of which is a schematic diagram of a short circuit protection circuit embodying the present invention.

With reference to the drawing, the short circuit protection circuit includes a first peak detector 1, a second peak detector 3, a pair of voltage comparators 5, and a pair of transistor switches 7.

The first peak detector 1 is a half-wave peak detector, and includes an operational amplifier 9 having a non-inverting input terminal 11, an inverting input terminal 13, and an output terminal 15. A feedback resistor 17 is connected between the inverting input terminal 13 and output terminal 15 of operational amplifier 9; a bias resistor 19 is connected between the inverting input terminal 13 and a point of reference potential such as ground. The non-inverting input terminal 11 of operational amplifier 9 is connected through a bias resistor 21 to ground and through a non-polar coupling capacitor 23 to a signal input terminal 25. The output terminal 15 of operational amplifier 9 is connected to the anode of a rectifying diode 27 whose cathode is connected through a peak detector capacitor 29 to ground and to the input terminal 31 of a resistive voltage divider. The latter includes a resistor 33 connected with one end to input terminal 31 and its other end to output terminal 37 and through a second resistor 35 to ground.

The second peak detector 3 is a full-wave peak detector, and includes first and second operational amplifiers 39 and 47. The first operational amplifier 39 has an inverting input terminal 41, a non-inverting input terminal 43, and an output terminal 45. Similarly, the second operational amplifier 47 has a non-inverting input terminal 49, an inverting input terminal 51, and an output terminal 53.

Operational amplifier 39 has its output terminal 45 connected through feedback resistor 55 to its inverting input terminal 41; its output terminal is also connected to the anode of a rectifying diode 57, the cathode of the diode 57 being connected to one terminal of a peak detecting capacitor 59, the other terminal of which is connected to ground. The inverting input terminal 41 is also connected through an input resistor 61 to the connection between one end of a sensing resistor 63, an end of a coupling capacitor 65, and an end of an input resistor 67. Resistor 67 is connected at its other end to the non-inverting input terminal 49 of operational amplifier 47. The non-inverting input terminal 43 of amplifier 39 is connected through an input resistor 69 to ground; the other end of the sensing resistor 63 is also grounded. The other end of coupling capacitor 65 being connected through a resistor 71 to ground and through a resistor 73 to a signal input terminal 75.

Operational amplifier 47 has its output terminal 53 connected through a feedback resistor 77 to its inverting input terminal 51; its output terminal 53 is also connected to the anode of a rectifying diode 79, the cathode of diode 79 being connected to the cathode of diode 57; its inverting input terminal 51 is also connected through an input resistor 81 to ground. The joint connection of the cathodes of the rectifying diodes 57, 79 and capacitor 59 is connected to an input terminal 83 of a resistive voltage divider including a resistor 85 having one end connected to the input terminal 83, and another end connected through a resistor 87 to ground; the junction of resistors 85 and 87 is connected to an output terminal 89, output terminal 89 being the signal output terminal 89 of the full-wave peak detector 3.

The pair of voltage comparators 5 includes two operational amplifiers 91 and 93. Operational amplifier 91 has an output terminal 95, a non-inverting input terminal 97, and an inverting input terminal 99. A feedback resistor 101 is interconnected between the output terminal 95 and inverting input terminal 99. Similarly, operational amplifier 93 has an output terminal 103, inverting input terminal 105, and a non-inverting input terminal 107, its output terminal 103 being connected through a feedback resistor 109 to its inverting input terminal 105.

The pair of voltage comparators 5 also includes a pair of signal input terminals 111 and 113. Signal input terminal 111 is connected through an input resistor 115 to the inverting input terminal 99 of operational amplifier 91, and through another input resistor 117 to the non-inverting input terminal 107 of operational amplifier 93. Signal input terminal 113 is connected through an input resistor 119 to the non-inverting input terminal 97 of operational amplifier 91, and through another input resistor 121 to the inverting input terminal 105 of operational amplifier 93. Signal input terminal 111 is also connected to signal output terminal 89 of the peak signal detector 3; and signal input terminal 113 is also connected to the signal output terminal 37 of the peak voltage detector 1.

The switching means 7, that is, the pair of output switches 7 includes a pair of input terminals 123, 125; a pair of output terminals 127, 129; four diodes 131, 133, 135, 137; two grounding resistors 139, 141; two parasitic oscillation shunt capacitors 143, 145; an NPN transistor 147; and a PNP transistor 149.

NPN transistor 147 operates as a transistor switch. Its emitter electrode is grounded, its collector electrode is connected to the cathode of diode 133, and its base is connected through grounding resistor 139 to ground and also to the cathode of diode 131. The anode of diode 133 is connected to output terminal 127; capacitor 143 is connected across diode 133. The anode of diode 131 is connected to the input terminal 123.

PNP transistor 149 is connected at its emitter electrode to ground, at its collector electrode to the anode of diode 137, and at its base electrode through resistor 141 to ground and to the anode of diode 135. The cathode of diode 137 is connected to output terminal 129; capacitor 145 is connected in parallel with diode 137. The cathode of diode 135 is connected to the input terminal 125.

The input terminal 123 of transistorized switching means 7 is connected through resistor 151 to the output terminal 95 of operational amplifier 91 of voltage comparator 5; the other input terminal 125 is connected through resistor 153 to output terminal 103 of operational amplifier 93 of voltage comparator 5.

The circuit described can be used to protect various electronic devices against short circuits across their output terminals, such devices including audio amplifiers, DC-DC converters, and so forth. The circuit can also be used in ground or phase connection loss sensing.

For example, to protect an audio amplifier such as 154 against short circuits, the signal input terminal 25 of peak detector 1 is connected to the signal input terminal 26 of the audio amplifier, and the signal ground connection of the audio amplifier is connected to the signal ground terminal 155 of the short circuit protection circuit. The positive or "hot" output terminal 28 of the amplifier, or the hot terminal of the speaker, is connected to the signal input terminal 75 of peak detector 3, while the ground terminal 157 of peak detector 3 is connected to the ground side of the output terminal of the amplifier or the ground side of the speaker input terminal. The amplifier 154, as is well understood, has a number of amplification stages. Only the last such stage is shown, in part, at the right of the FIGURE, by the phantom showing of the complementary transistors 128, 130 of this stage. Note that terminal 127 is connected to the base of NPN transistor 128 and terminal 129 to the base of PNP transistor 130.

If the amplifier has a biasing network for the output stage, such as, for example, a $V_{BE}$ multiplier transistor (not shown), and that transistor is an NPN transistor, then output terminal 127 of switching means 7 should be connected to the collector of the NPN $V_{BE}$ transistor, and output terminal 129 of switching means 7 would be connected to the emitter of the $V_{BE}$ multiplier transistor. If the $V_{BE}$ transistor were a PNP transistor (not shown), then output terminal 127 would be connected to the emitter of the $V_{BE}$ transistor, and the output terminal 129 would be connected to the collector of the $V_{BE}$ PNP transistor.

The voltage divider formed by resistors 73 and 71 of peak detector 3, the resistors being connected in series between the signal input terminal 75 and ground of the peak detector 3, must be adjusted in value to provide for interconnection to either the output terminal of the amplifier or the input terminal of the speaker. The resistors 71 and 73 serve as a voltage divider across the input circuit of the peak detector 3 to permit voltage monitoring, while limiting the monitoring level to within the common mode range of the operational amplifiers 39 and 47 of the peak detector 3.

The short circuit protection circuit operates to protect, for example, an audio amplifier against short circuits in the following manner. The peak detector 1 monitors the audio signal input to the amplifier and produces at its output terminal 37 a DC voltage signal proportional to the peak amplitude of this signal input. The peak signal detector 3 monitors the output signal of the amplifier, and provides a DC output signal at its output terminal 89 proportional to the peak amplitude of the output signal of the amplifier. The peak signals detected by peak detector 1 and peak detector 3 are compared by operational amplifiers 91 and 93. If a short circuit develops across the output terminals of the audio amplifier, the signal output from the peak detector 3 will drop in magnitude. If during the same period the audio signal input to the amplifier remains present, the peak signal output from the peak detector 1 will remain relatively unchanged in magnitude. The change in the relative magnitudes of the peak signals developed across the output terminals 111, 113 of the peak signal detectors 3, 1 will cause the voltage comparators 91, 93 to operate to drive the transistor switches 147, 149 into saturation.

When transistor 147 is operated at saturation, the base of the NPN driver transistor (shown in phantom view at 128) of the audio amplifier is connected to ground through diode 133 and the collector-emitter path of the NPN switching transistor 147, causing any driving signals supplied to the NPN transistor of the amplifier to be shunted to ground. Similarly, the saturation of the PNP transistor 149 provides a ground path from the base of the PNP driver transistor (shown in phantom view at 130) of the audio amplifier through diode 137 and the collector-emitter path of transistor 49 to ground, so that any drive signals applied to the base of the PNP driver transistor of the amplifier are shunted to ground. In this manner, drive signals to the output stage of the amplifier are shunted to ground by the short circuit protection circuit whenever the ratio of the peak output signal of the amplifier to the peak magnitude of the input signal of the amplifier decreases to below a predetermined value.

The predetermined value is controlled by the value of the resistances of the resistors 85 and 87 of the voltage divider of the peak detector 3, and the resistors 33 and 35 of the resistive voltage divider of the peak detector 1.

If the output terminals 127 and 129 of the switching means 7 were connected across the collector and emitter electrodes of a $V_{BE}$ multiplier transistor, as previously suggested, the short circuit protection circuit would operate upon the occurrence of a short circuit across the output of the audio amplifier to disable the $V_{BE}$ multiplier transistor of the amplifier, which in turn would remove drive signals from the output driver stage of the audio amplifier. When the output driver stage of the audio amplifier is so disabled, no current will flow through the output transistors of the output stage, thereby providing full protection of the audio amplifier against any short circuits occurring across its output terminals. Upon removal of the short circuit and momentary removal of the input signal to the amplifier the short circuit protection circuit will automatically reset itself and permit normal operation of the amplifier.

In other words, the short circuit protection circuit provides short circuit protection to an audio amplifier by simultaneously sensing the voltages developed across the input terminals of a loudspeaker or across the output terminal of the audio amplifier, and at the input terminals of the audio amplifier. The output voltage of the audio amplifier is amplified through operational amplifiers 39 and 47 of peak detector 3, then full-wave rectified through diodes 57 and 79 of peak detector 3. The amplified and rectified output voltage of the audio amplifier is used to charge the capacitor 59 of peak detector 3 to a voltage proportional to the peak amplitude of the output signal of the audio amplifier. Similarly, the input voltage to the amplifier is amplified through the operational amplifier 9 of the peak detector 1, rectified by the diode 27, and connected to charge capacitor 29 to a voltage proportional to the peak amplitude of the signal input voltage to the amplifier. The peak voltage across the capacitor 59 of peak detector 3 is divided down by the voltage divider formed by the resistors 85 and 87, and the peak voltage across capacitor 29 of peak detector 1 is divided down by the resistive voltage divider formed by the resistors 33 and 35. The resistance values of the resistors of the voltage dividers of the peak voltage detectors 1 and 3 are adjusted to insure that the peak voltage detected across the output terminal 89 of peak detector 3 is normally always greater than the peak voltage developed across the output terminal 37 of peak detector 1.

In normal operation, the output signal of operational amplifier 91 will be negative, and the voltage output signal from operational amplifier 93 will be positive, thereby maintaining NPN transistor 147 and PNP transistor 149 of switching means 7 in a cutoff condition. If the output terminals of the audio terminals of the speaker driven by the audio amplifier output signal become short circuited, while there is a voltage across (a signal present at) the input terminals of the amplifier, the peak signal output voltage at the output terminal 89 of peak detector 3 drops in amplitude. This output voltage at 89 reduces to zero for a direct short circuit or a very low resistance short, while the voltage at 37 remains at its initial value. In response to this condition, operational amplifiers 91 and 93 of the voltage comparator 5 operate to change the polarities of the voltages at their output terminals 95 and 103. The signal at output terminal 95 goes positive causing NPN transistor 147 to saturate. The signal at output terminal 103 goes negative, causing PNP transistor 149 to saturate.

If no input signal is being applied to the input terminal of the audio amplifier, at a time when a short circuit occurs across the output terminals of the audio amplifier or across the input terminals of the loudspeaker, the short circuit protection circuit will be inoperative, and switching transistors 147 and 149 will remain in their cutoff condition.

In a similar manner, the short circuit protection circuit can be used to protect a DC-DC converter. To protect such a converter with the protection circuit, the input terminal 25, of the peak detector 1 is connected to the output terminal of the oscillator driver of the converter; the input terminal 75 of the peak detector 3 is connected to the output terminal of the converter or power supply to monitor the output signals of the supply in the voltage mode only; and either one or both of the output terminals 127 and 129 of the transistors switches 147 and 149 are connected in such a manner to the converter, that whenever the output of the converter is shorted, the short circuit protection circuit will operate to remove the drive signals connected to the oscillator driver of the converter.

It should be noted that although peak detector 3 is shown in the drawing and described herein as a full-wave detector, this is a preferred embodiment. Peak detector 3 can also be configured in a half-wave configuration, but false triggering of the pair of transistor switches 7 may occur at such times that peak detector 1 responds more quickly to changes in its input signal than peak detector 3. To prevent such false triggering, peak detector 3 is configured as a full-wave peak detector, ensuring that it will always have a faster response time to changes in its input signal than the half-wave peak detector configuration of peak detector 1.

What is claimed is:

1. A short circuit protection circuit for an audio amplifier which includes an input terminal, an output terminal, an NPN driver transistor having a base electrode, and a PNP driver transistor having a base electrode, said circuit comprising:

first sensing means coupled to the input terminal of said audio amplifier for producing an output voltage proportional in magnitude to the magnitude to the signal at said input terminal;

second sensing means coupled to the output terminal of said audio amplifier for producing an output voltage proportional in magnitude to the magnitude of the signal appearing at said output terminal;

comparator means coupled to said two sensing means for comparing their output voltages and for producing an output signal manifestation indicative of the sense of the difference between these voltages; and switching means responsive to said signal manifestation for providing relatively low impedance paths between said base electrodes and a point of reference potential when said output voltages differ in one sense and relatively high impedance paths when said output voltages differ in the opposite sense.

2. The short protection circuit of claim 1, wherein said first sensing means includes a first peak signal detector, for detecting the peak signal amplitude of signals appearing at the input terminal of said audio amplifier.

3. The short circuit protection circuit of claim 2, wherein said second sensing means includes a second peak detector, for detecting the peak signal amplitude of signals appearing at the output of said amplifier.

4. A circuit for protecting an electronic device having an input terminal receptive of an alternating signal, and output terminals, when a short circuit occurs between its output terminals, said device including a driver state which applies signals between said output terminals, comprising:

first rectifying means coupled to said input terminal for producing a rectified output signal proportional in magnitude to the signal present at said input terminal;

second rectifying means coupled to said output terminals, for producing a rectified output signal proportional in magnitude to the signal present between said output terminals;

comparator means responsive to the output signals produced by said first and second rectifying means, for producing a signal manifestation indicative of the ratio between said output signals; and means responsive to said signal manifestation for inactivating the driver stage when said ratio reduces to lower than a given value.

5. A circuit as set forth in claim 4, wherein said first and second rectifying means each comprises a peak signal detection circuit.

6. A circuit as set forth in claim 4, wherein said first rectifying means comprises a half-wave rectifier having an input terminal connected to said input terminal of said device, and an output terminal for providing a DC output signal proportional in magnitude to said input signal to said device; and said second rectifying means comprises a full-wave rectifier having input terminals connected across said output terminals of said device, and an output terminal for providing a DC output signal proportional in magnitude to the output signal of said device.

7. Apparatus for protecting an electronic device when a low impedance appears across its output terminals, the electronic device having an input terminal receptive of an alternating signal, and an output stage which supplies output signals to said output terminals, comprising:

means for rectifying the alternating signal present at said input terminal;

means for rectifying the output signal present across said output terminals;

means for comparing the amplitude of the rectified output signal with that of the rectified input signal; and means for inactivating said output stage, when the ratio of the rectified output signal amplitude to the rectified input signal amplitude decreases to lower than a predetermined value.

8. Apparatus as set forth in claim 7, wherein said output stage includes an input circuit, and wherein said means for inactivating said output stage comprises means for placing a low impedance across said input circuit.

9. Apparatus as set forth in claim 7 wherein each means for rectifying comprises means for peak signal detecting.

10. Protection means for protecting a circuit from damage when the effective impedance of the load driven by the circuit reduces to a value substantially lower than its normal value, the circuit including input terminals to which an alternating input signal may be applied, and an output driver stage receptive of a drive signal and having two output terminals between which the load may be connected, said protection means comprising:

means coupled to said input terminals for rectifying said input signal;

means coupled to said output terminals for rectifying the signal present at said output terminals;

means responsive to said rectified input and output signals for producing a signal manifestation indicative of the ratio between the signal present between said output terminals that present between said input terminals; and means responsive to said signal manifestation for removing the signal from said driver stage, when said manifestation indicates a ratio lower than a given value.

11. Protection means as set forth in claim 10 wherein each means for rectifying includes means for peak value detecting each signal.

* * * * *

UNITED STATES PATENT OFFICE
CERTIFICATE OF CORRECTION

PATENT NO. : 3,931,547
DATED : January 6, 1976
INVENTOR(S) : Miroslav Glogolja

It is certified that error appears in the above-identified patent and that said Letters Patent are hereby corrected as shown below:

Claim 4, line 5, change "state" to read --stage--.

Signed and Sealed this twentieth Day of April 1976

[SEAL]

Attest:

RUTH C. MASON
*Attesting Officer*

C. MARSHALL DANN
*Commissioner of Patents and Trademarks*